(12) United States Patent
Shi et al.

(10) Patent No.: US 10,515,601 B2
(45) Date of Patent: Dec. 24, 2019

(54) GOA CIRCUIT FOR PREVENTING CLOCK SIGNALS FROM MISSING

(71) Applicant: Shenzhen China Star Optoelectronics Semiconductor Display Technology Co., Ltd., Shenzhen (CN)

(72) Inventors: Longqiang Shi, Shenzhen (CN); Shujhih Chen, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 163 days.

(21) Appl. No.: 15/578,251

(22) PCT Filed: Sep. 15, 2017

(86) PCT No.: PCT/CN2017/101977
§ 371 (c)(1),
(2) Date: Nov. 30, 2017

(87) PCT Pub. No.: WO2019/041388
PCT Pub. Date: Mar. 7, 2019

(65) Prior Publication Data
US 2019/0073978 A1 Mar. 7, 2019

(30) Foreign Application Priority Data
Sep. 4, 2017 (CN) .......................... 2017 1 0788014

(51) Int. Cl.
*G09G 3/36* (2006.01)

(52) U.S. Cl.
CPC ....... *G09G 3/3677* (2013.01); *G09G 2310/06* (2013.01); *G09G 2310/08* (2013.01)

(58) Field of Classification Search
None
See application file for complete search history.

(56) References Cited

U.S. PATENT DOCUMENTS

2007/0152994 A1* 7/2007 Koh .......................... H04N 5/63
345/211
2017/0186361 A1* 6/2017 Lin ....................... G09G 3/2092

* cited by examiner

*Primary Examiner* — Gustavo Polo
(74) *Attorney, Agent, or Firm* — Leong C. Lei

(57) ABSTRACT

The present invention involves a GOA circuit for preventing clock signals from missing. The GOA circuit comprises a plurality of cascaded GOA units. The N-th stage GOA unit comprises a pull-high stage-transfer unit, a pull-down unit, and a pull-down sustain unit, which are respectively connected with a first node (Q(N)) and a gate signal output terminal (G(N)) of the N-th stage GOA unit. The pull-high control unit is connected with the first node (Q(N)) of the N-th stage GOA unit. From a specific stage, each of the GOA unit further comprises an additional circuit for preventing clock signals from missing. The additional circuit is connected with the pull-down sustain unit. When the clock signal is missing, the additional circuit utilizes the start signal (STV), a first low-frequency clock signal (LC1), and the second low-frequency clock signal (LC2) which are capable of lowering the potential of the first node (Q(N)) of the N-th stage GOA unit. The GOA circuit for preventing clock signals from missing of the present invention, which is capable of solving the problem that the display signal is damaged due to the disappearance of the clock signal.

14 Claims, 7 Drawing Sheets

GOA CIRCUIT FOR PREVENTING CLOCK SIGNALS FROM MISSING

BACKGROUND OF THE INVENTION

Field of Invention

The present invention relates to the field of liquid crystal display, and more particularly to a GOA circuit for preventing clock signals from missing.

Description of Prior Art

Flat panel display devices such as the liquid crystal display (LCD) has been widely used in various consumer electronic products such as mobile phones, televisions, personal digital assistants, digital cameras, notebooks, and desktop with high quality, power saving, thin body and wide application range, and has become the mainstream of the display devices.

GOA technology, the Gate Driver ON Array technology, which can use the original process of the liquid crystal display panel to produce the driving circuit of the horizontal scanning line on the substrate around the display area, so that the GOA can replace the external IC to complete the driving of the horizontal scanning lines. The existing GOA circuit typically includes multiple cascaded GOA units, each stage GOA unit corresponding to driving a horizontal scanning line. FIG. 1 shows a diagram of one stage GOA circuit. The main structure of the GOA unit comprises a pull-high control unit 10 which is responsible for generating a scan-control signal for controlling the operation of the pull-high stage-transfer unit 20, and is generally connected with a down-transfer signal or a gate signal transmitted from a previous stage GOA unit; a pull-high stage-transfer unit 20, which is connected with the pull-high control unit 10 to convert the clock signal into a row scanning signal in accordance with the received scan-control signal; a pull-down unit 30 connected with the pull-high control unit 10 and the pull-high stage-transfer unit 20 for pulling the scan-control signal and the row scanning signal down to low voltages; a pull-down sustain unit 40, which is connected with the pull-high control unit 10 and the pull-high stage-transfer unit 20 for keeping the scan-control signal and the row scanning signal at low voltages. Generally, there are two pull-down sustain modules for alternative working, the pull-down sustain modules are respectively connected with a low-frequency clock signal LC1 and a low-frequency clock signal LC2.

The waveforms of signals, important nodes and voltages required to control the conventional GOA circuit are shown in FIG. 2. Among them, STV is a start signal (alternating current) and opens once in each frame, for starting top few GOA units, the high potential of the STV is 28V, the low potential of the STV is −7V. The clock signals CK1 to CK8 are high-frequency alternating current. Large-size and high-resolution panels are generally driven by a plurality of high-frequency clock signals, time of a pulse width of each clock signal CK is 4H (one H is a time of a data), the cycle time is 8H. Among them, the time CK1 delays STV signal is an H, an H time difference is between the adjacent CKs. The high/low potentials of CK are 28V/−7V. LC1 and LC2 are low-frequency AC power supplies. The two signals have exactly opposite phases, that is, when LC1 is high, LC2 is low; when LC1 is low, and LC2 is high. A pulse width of LC is 100 frames; the cycle time of LC is 200 frames. The high potential of LC is 28V and the low potential of LC is −7V. VSS is a low voltage DC power supply with a potential of −7V. G(N) is the output waveform of gate electrode of the current stage GOA unit, ST (N) and Q(N) are the waveforms of the important nodes of the current stage GOA unit; ST (N+4) is a waveform at the previous four stages GOA unit; ST(N+4) and Q (N+4) are waveforms at following four stage stages GOA unit from the ST (N) and Q (N), respectively. The first four stages of the GOA circuit, the T11 of the circuit that controls Gates 1 to Gate 4, are controlled by STV.

Please refer to FIG. 3, which is an illustrative diagram of waveforms of the signals and important nodes required for controlling the GOA circuit when the clock signal CK is missing. In daily applications, the clock signal CK disappears suddenly in one frame due to environmental effects such as signal interference. The disappearance of the clock signal results the abnormal outputs of current stage Q (N), and then Q (N+4) and ST (N+4), which can only be eliminated when the next frame CK is restored. This phenomenon can cause high current, the display may be damaged.

SUMMARY OF THE INVENTION

Therefore, an object of the present invention is to provide a GOA circuit for preventing clock signals from missing, which solves the problem that the display signal is damaged due to the disappearance of the clock signal.

In order to achieve the object, the present invention provides a GOA circuit for preventing clock signals from missing, which comprises a plurality of cascaded GOA units. Wherein the N-th stage GOA unit controls charging of the N-th stage horizontal scanning line. The N-th stage GOA unit comprises a pull-high control unit, a pull-high stage-transfer unit, a pull-down unit, and a pull-down sustain unit. The pull-high stage-transfer unit, the pull-down unit and the pull-down sustain unit are respectively connected with a first node and a gate signal output terminal of the N-th stage GOA unit. Two alternative functional pull-down modules of the pull-down sustain unit are respectively connected with a first low-frequency clock signal and a second low-frequency clock signal. The pull-high control unit is connected with the first node of the N-th stage GOA unit.

From a specific stage, each of the GOA unit further comprises an additional circuit for preventing clock signals from missing. The additional circuit is connected with a start signal, the first low-frequency clock signal, and the second low-frequency clock signal. When the clock signal is missing and a next frame is turned on, the start signal passed through with a high potential, the first low-frequency clock signal and the second low-frequency clock signal which have reversed potential are capable of controlling the potential of the first node of the N-th stage GOA unit.

Wherein the pull-down sustain unit comprises:

A first thin film transistor. A gate electrode of the first thin film transistor is connected with a second node of the N-th stage GOA unit, a source electrode and a drain electrode of the first thin film transistor are respectively connected with the gate signal output terminal and a constant low-voltage signal.

A second thin film transistor. A gate electrode of the second thin film transistor is connected with a third node of the N-th stage GOA unit, a source electrode and a drain electrode of second thin film transistor are respectively connected with the gate signal output terminal and the constant low-voltage signal.

A third thin film transistor. A gate electrode of the third thin film transistor is connected with the second node; a source electrode and a drain electrode of the third thin film transistor are respectively connected with the first node and the constant low-voltage signal.

A fourth thin film transistor. A gate electrode of the fourth thin film transistor is connected with the third node; a source electrode and a drain electrode of the fourth thin film transistor are respectively connected with the first node and the constant low-voltage signal.

A fifth thin film transistor. A gate electrode of the fifth thin film transistor is connected with the first low-frequency clock signal, a source electrode and a drain electrode of the fifth thin film transistor are respectively connected with the first low-frequency clock signal and a gate electrode of a sixth thin film transistor.

The sixth thin film transistor. A source electrode and a drain electrode of the sixth thin film transistor are respectively connected with the first low-frequency clock signal and the second node.

A seventh thin film transistor. A gate electrode of the seventh thin film transistor is connected with the first node; a source electrode and a drain electrode of the seventh thin film transistor are respectively connected with the constant low-voltage signal and the gate electrode of the sixth thin film transistor.

An eighth thin film transistor. A gate electrode of the eighth thin film transistor is connected with the first node; a source electrode and a drain electrode of the eighth thin film transistor are respectively connected with the constant low-voltage signal and the second node.

A ninth thin film transistor. A gate electrode of the ninth thin film transistor is connected with the second low-frequency clock signal, a source electrode and a drain electrode of the ninth thin film transistor are respectively connected with the second low-frequency clock signal and a gate electrode of a tenth thin film transistor.

The tenth thin film transistor. A source electrode and a drain electrode of the tenth thin film transistor are respectively connected with the second low-frequency clock signal and the third node.

An eleventh thin film transistor. A gate electrode of the eleventh thin film transistor is connected with the first node, a source electrode and a drain electrode of the eleventh thin film transistor are respectively connected the constant low-voltage signal and the gate of the tenth thin film transistor.

A twelfth thin film transistor. A gate electrode of the twelfth thin film transistor is connected with the first node; a source electrode and a drain electrode of the twelfth thin film transistor are respectively connected with the constant low-voltage signal and the third node.

Wherein the additional circuit comprises:

A thirteenth thin film transistor. A gate electrode of the thirteenth thin film transistor is connected with the start signal, a source electrode and a drain electrode of the thirteenth thin film transistor are respectively connected with the first node and a gate of a fourteenth thin film transistor.

The fourteenth thin film transistor. A source electrode and a drain electrode of the fourteenth thin film transistor are respectively connected with the gate of the fourteenth thin film transistor and the first low-frequency clock signal.

A fifteenth thin film transistor. A gate electrode of the fifteenth thin film transistor is connected with the start signal, a source electrode and a drain electrode of the fifteenth thin film transistor are respectively connected with the first node and a gate electrode of a sixteenth thin film transistor.

The sixteenth thin film transistor. A source electrode and a drain electrode of the sixteenth thin film transistor are respectively connected with the gate of the sixteenth thin film transistor and the second low-frequency clock signal.

Wherein the additional circuit comprises:

A seventeenth thin film transistor. A gate electrode of the seventeenth thin film transistor is connected with the start signal; a source electrode and a drain electrode of the seventeenth thin film transistor are respectively connected with the first low-frequency clock signal and the second node.

An eighteenth thin film transistor. A gate electrode of the eighteenth thin film transistor is connected with the start signal; a source electrode and a drain electrode of the eighteenth thin film transistor are respectively connected with the second low-frequency clock signal and the third node.

Wherein the additional circuit comprises:

A seventeenth thin film transistor. A gate electrode of the seventeenth thin film transistor is connected with the start signal; a source electrode and a drain electrode of the seventeenth thin film transistor are respectively connected with the first low-frequency clock signal and the second node.

An eighteenth thin film transistor. A gate electrode of the eighteenth thin film transistor is connected with the start signal; a source electrode and a drain electrode of the eighteenth thin film transistor are respectively connected with the second low-frequency clock signal and the third node.

A nineteenth thin film transistor. A gate electrode of the nineteenth thin film transistor is connected with the start signal; a source electrode and a drain electrode of the nineteenth thin film transistor are respectively connected with the second node and the third node.

Wherein the pull-high control unit comprises a twentieth thin film transistor.

For top four GOA units, a gate of the twentieth thin film transistor is connected with the start signal, and a source electrode and a drain electrode of the twentieth thin film transistor are respectively connected with the start signal and the first node.

From a fifth stage GOA unit, the gate of the twentieth thin film transistor is connected with a stage-transfer signal output terminal of a (N−4)th stage GOA unit, and the source electrode and the drain electrode of the twentieth thin film transistor are respectively connected with the stage-transfer signal output terminal and the first node.

From a ninth stage, each of the GOA unit comprises the additional circuit for preventing clock signals from missing.

Wherein the pull-high stage-transfer unit comprises:

A twenty-first thin film transistor. A gate of the twenty-first thin film transistor is connected with the first node, and a source electrode and a drain electrode of the twenty-first thin film transistor are respectively connected with the gate signal output terminal and a clock signal of an N-th stage GOA unit.

A twenty-second thin film transistor. A gate of the twenty-second thin film transistor is connected with the first node, and a source electrode and a drain electrode of the twenty-second thin film transistor are respectively connected with a stage-transfer signal output terminal of the N-th stage GOA unit and a clock signal of the N-th stage GOA unit.

A bootstrap capacitor comprises two terminals are respectively connected with the first node and the gate signal output terminal.

Wherein the pull-down unit comprises:

A twenty-third thin film transistor. A gate of the twenty-third thin film transistor is connected with a stage-transfer signal output terminal of the (N+4)th stage GOA unit, and a source electrode and a drain electrode of the twenty-third thin film transistor are respectively connected with the first node and the constant low-voltage signal.

A twenty-fourth thin film transistor. A gate of the twenty-fourth thin film transistor is connected with the stage-transfer signal output terminal of the (N+4)th stage GOA unit, and a source electrode and a drain electrode of the twenty-fourth thin film transistor are respectively connected with the gate signal output terminal and the constant low-voltage signal.

In order to achieve the object, the present invention further provides a GOA circuit for preventing clock signals from missing, which comprises a plurality of cascaded GOA units. Wherein the N-th stage GOA unit controls charging of the N-th stage horizontal scanning line, the N-th stage GOA unit comprises a pull-high control unit, a pull-high stage-transfer unit, a pull-down unit, and a pull-down sustain unit. The pull-high stage-transfer unit, the pull-down unit and the pull-down sustain unit are respectively connected with a first node and a gate signal output terminal of the N-th stage GOA unit. Two alternative functional pull-down modules of the pull-down sustain unit are respectively connected with a first low-frequency clock signal and a second low-frequency clock signal. The pull-high control unit is connected with the first node of the N-th stage GOA unit.

From a specific stage, each of the GOA unit further comprises an additional circuit for preventing clock signals from missing. The additional circuit is connected with a start signal, the first low-frequency clock signal, and the second low-frequency clock signal. When the clock signal is missing and a next frame is turned on, the start signal passed through with a high potential, the first low-frequency clock signal and the second low-frequency clock signal which have reversed potential are capable of controlling the potential of the first node of the N-th stage GOA unit.

Wherein the pull-down sustain unit comprises:

A first thin film transistor. A gate electrode of the first thin film transistor is connected with a second node of the N-th stage GOA unit, a source electrode and a drain electrode of the first thin film transistor are respectively connected with the gate signal output terminal and a constant low-voltage signal.

A second thin film transistor. A gate electrode of the second thin film transistor is connected with a third node of the N-th stage GOA unit, a source electrode and a drain electrode of second thin film transistor are respectively connected with the gate signal output terminal and the constant low-voltage signal.

A third thin film transistor. A gate electrode of the third thin film transistor is connected with the second node; a source electrode and a drain electrode of the third thin film transistor are respectively connected with the first node and the constant low-voltage signal.

A fourth thin film transistor. A gate electrode of the fourth thin film transistor is connected with the third node; a source electrode and a drain electrode of the fourth thin film transistor are respectively connected with the first node and the constant low-voltage signal.

A fifth thin film transistor. A gate electrode of the fifth thin film transistor is connected with the first low-frequency clock signal, a source electrode and a drain electrode of the fifth thin film transistor are respectively connected with the first low-frequency clock signal and a gate electrode of a sixth thin film transistor.

The sixth thin film transistor. A source electrode and a drain electrode of the sixth thin film transistor are respectively connected with the first low-frequency clock signal and the second node.

A seventh thin film transistor. A gate electrode of the seventh thin film transistor is connected with the first node; a source electrode and a drain electrode of the seventh thin film transistor are respectively connected with the constant low-voltage signal and the gate electrode of the sixth thin film transistor.

An eighth thin film transistor. A gate electrode of the eighth thin film transistor is connected with the first node; a source electrode and a drain electrode of the eighth thin film transistor are respectively connected with the constant low-voltage signal and the second node.

A ninth thin film transistor. A gate electrode of the ninth thin film transistor is connected with the second low-frequency clock signal, a source electrode and a drain electrode of the ninth thin film transistor are respectively connected with the second low-frequency clock signal and a gate electrode of a tenth thin film transistor.

The tenth thin film transistor. A source electrode and a drain electrode of the tenth thin film transistor are respectively connected with the second low-frequency clock signal and the third node.

An eleventh thin film transistor. A gate electrode of the eleventh thin film transistor is connected with the first node, a source electrode and a drain electrode of the eleventh thin film transistor are respectively connected the constant low-voltage signal and the gate of the tenth thin film transistor.

A twelfth thin film transistor. A gate electrode of the twelfth thin film transistor is connected with the first node; a source electrode and a drain electrode of the twelfth thin film transistor are respectively connected with the constant low-voltage signal and the third node.

Wherein the pull-high control unit comprises a twentieth thin film transistor.

For top four GOA units, a gate of the twentieth thin film transistor is connected with the start signal, and a source electrode and a drain electrode of the twentieth thin film transistor are respectively connected with the start signal and the first node.

From a fifth stage GOA unit, the gate of the twentieth thin film transistor is connected with a stage-transfer signal output terminal of a (N−4)th stage GOA unit, and the source electrode and the drain electrode of the twentieth thin film transistor are respectively connected with the stage-transfer signal output terminal and the first node.

From a ninth stage, each of the GOA unit comprises the additional circuit for preventing clock signals from missing.

Wherein the pull-high stage-transfer unit comprises:

A twenty-first thin film transistor. A gate of the twenty-first thin film transistor is connected with the first node, and a source electrode and a drain electrode of the twenty-first thin film transistor are respectively connected with the gate signal output terminal and a clock signal of an N-th stage GOA unit.

A twenty-second thin film transistor. A gate of the twenty-second thin film transistor is connected with the first node, and a source electrode and a drain electrode of the twenty-second thin film transistor are respectively connected with a stage-transfer signal output terminal of the N-th stage GOA unit and a clock signal of the N-th stage GOA unit.

A bootstrap capacitor comprises two terminals are respectively connected with the first node and the gate signal output terminal.

Wherein the pull-down unit comprises:

A twenty-third thin film transistor. A gate of the twenty-third thin film transistor is connected with a stage-transfer signal output terminal of the (N+4)th stage GOA unit, and a source electrode and a drain electrode of the twenty-third thin film transistor are respectively connected with the first node and the constant low-voltage signal.

A twenty-fourth thin film transistor. A gate of the twenty-fourth thin film transistor is connected with the stage-transfer signal output terminal of the (N+4)th stage GOA unit, and a source electrode and a drain electrode of the twenty-fourth thin film transistor are respectively connected with the gate signal output terminal and the constant low-voltage signal.

In summary, the GOA circuit for preventing clock signals from missing of the present invention, which solves the problem that the display signal is damaged due to the disappearance of the clock signal.

BRIEF DESCRIPTION OF THE DRAWINGS

For better understanding the technical proposals and other beneficial effects of the present invention, please refer the following detailed description of the present invention with the accompanying drawings.

In drawings.

DETAILED DESCRIPTION OF THE PREFERRED EMBODIMENTS

Figure 4:
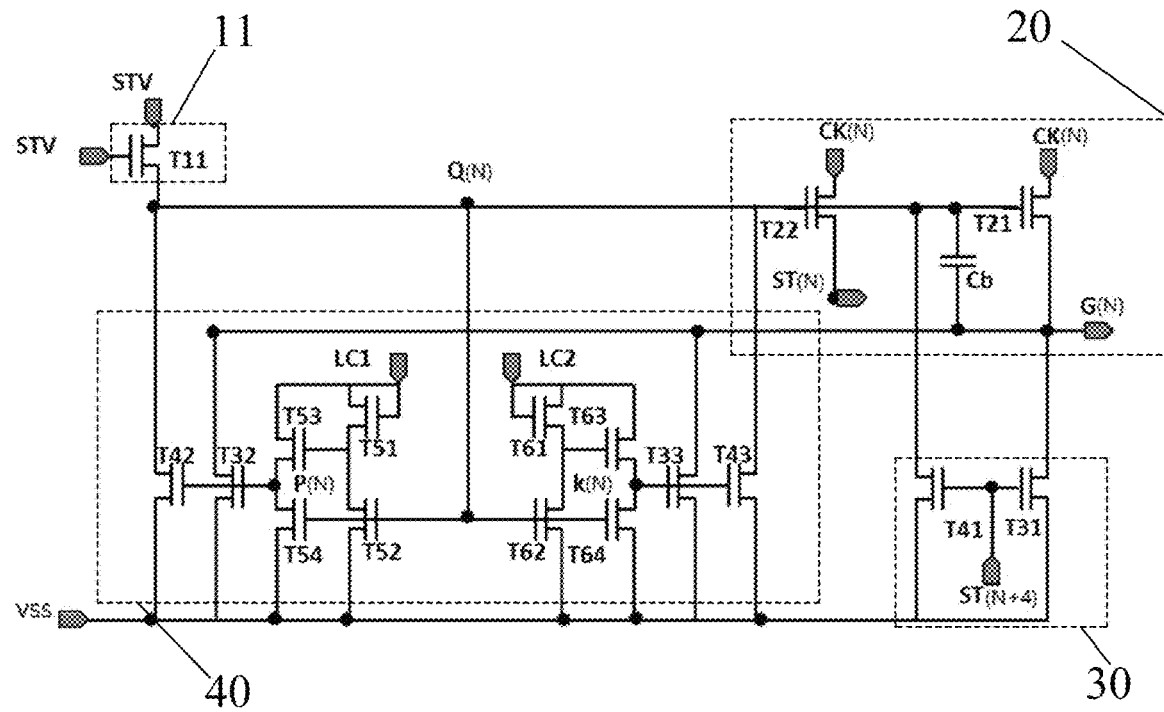
FIG. 4 shows an illustrative diagram of top four stage GOA circuits of a preferred embodiment according to the present invention.

Please refer to FIG. 4, which shows an illustrative diagram of top four stage GOA circuits of a preferred embodiment according to the present invention. The GOA circuit for preventing clock signals from missing of the present invention comprises a plurality of cascaded GOA units. The N-th stage GOA unit controls charging of the N-th stage horizontal scanning line. The N-th stage GOA unit comprises a pull-high control unit 11, a pull-high stage-transfer unit 20, a pull-down unit 30, and a pull-down sustain unit 40. The pull-high stage-transfer unit 20, the pull-down unit 30 and the pull-down sustain unit 40 are respectively connected with a node Q(N) and a gate signal output terminal G(N) of the N-th stage GOA unit. The pull-high control unit 11 comprises a thin film transistor T11. The pull-high stage-transfer unit 20 comprises thin film transistors T21, T22. The pull-down sustain unit 40 comprises a thin film transistor T32, a thin film transistor T33, a thin film transistor T42, a thin film transistor T43, a thin film transistor T51, a thin film transistor T53, a thin film transistor T52, a thin film transistor T54, a thin film transistor T61, a thin film transistor T63, a thin film transistor T62, and a thin film transistor T64.

In the preferred embodiment, for top four GOA units, T11 of the pull-high control unit 11 is controlled by start signal STV.

Figure 5:
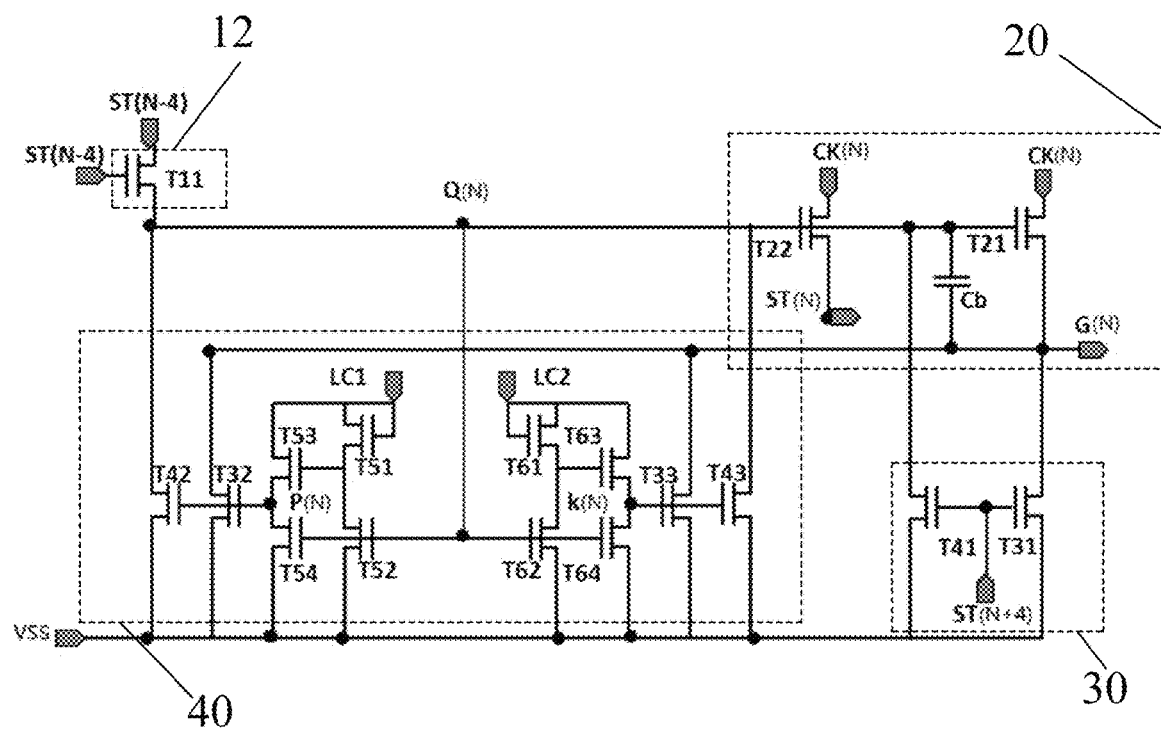
FIG. 5 shows an illustrative diagram of 5-8 stage GOA circuits of a preferred embodiment according to the present invention.

Please refer to FIG. 5, which shows an illustrative diagram of 5-8 stage GOA circuits of a preferred embodiment according to the present invention. In the preferred embodiment, for 5-8 GOA units, T11 of the pull-high control unit 11 is controlled by a stage-transfer signal ST(N−4). The structure of the pull-high stage-transfer unit 20, the pull-down unit 30, and the pull-down sustain unit 40 keeps unchanged.

In order to solve the problem that the display signal is damaged due to the disappearance of the clock signal, in the present invention, each of the GOA unit comprises an additional circuit for preventing clock signals from missing, from a specific stage. When the clock signal is missing, the additional circuit utilizes the start signal STV, a first low-frequency clock signal LC1, and the second low-frequency clock signal LC2 which are capable of lowering the potential of the first node Q(N) of the N-th stage GOA unit.

For example, the present invention has been designed 3 kinds of GOA circuits from a ninth stage.

Figure 6:
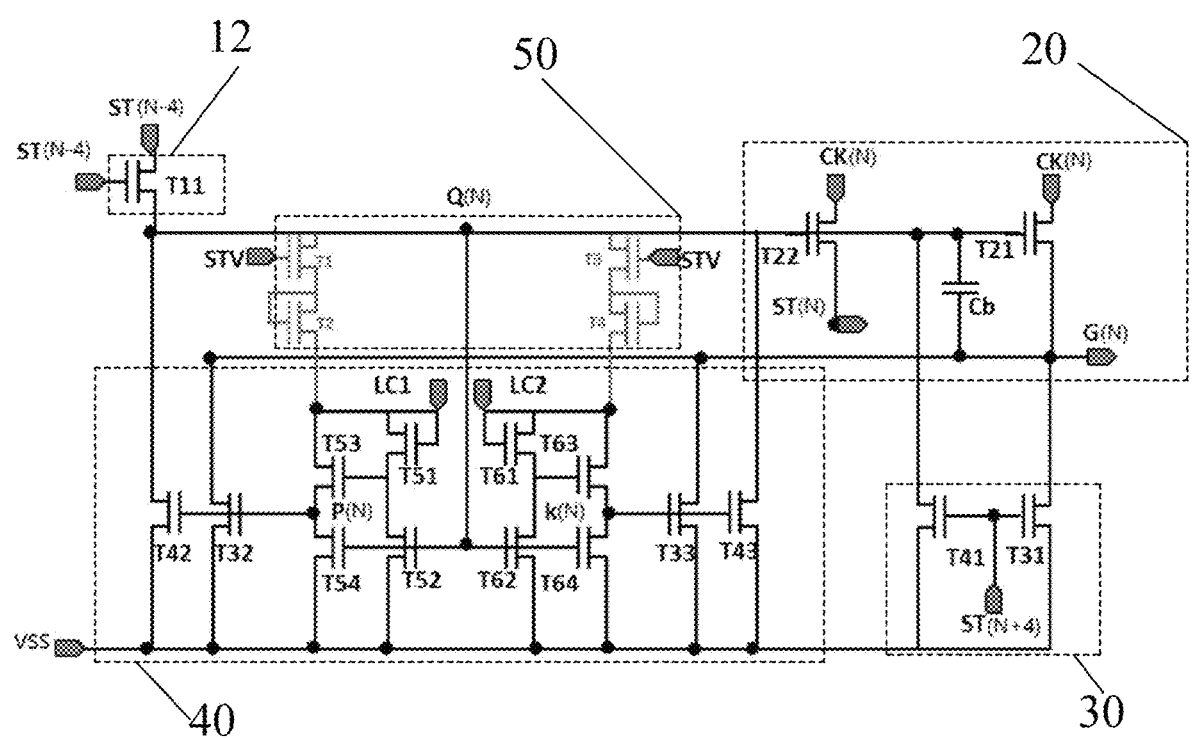
FIG. 6 shows an illustrative diagram of a ninth and following stage GOA circuits of a preferred embodiment according to the present invention.

Please refer to FIG. 6, which shows an illustrative diagram of a ninth and following stage GOA circuits of a preferred embodiment according to the present invention.

The first kind of GOA circuit is characterized by the addition of the additional circuit 50 which is constituted by four TFTs. The structure of the pull-high control unit 12, the pull-high stage-transfer unit 20, the pull-down unit 30, and the pull-down sustain unit 40 keeps unchanged. The pull-down sustain unit 40 which is controlled by T1, T2, and LC1 is one group. The pull-down sustain unit 40 which is controlled by T3, T4, and LC2 is one group. The function of the two new units is: when the CK signal is missing, when the STV of the second frame is turned on, the high potential of Q (N) can be pulled down, thus ensuring the normal output of the second frame.

The following is a description of the solution about CK missing.

The working principles of the two newly added units are the same. When LC1 is at a low potential, LC2 is at a high potential, the group (T1, T2) works. Similarly, when LC1 is at a high potential, LC2 is at a low potential, the group (T3, T4) works.

The following is the description of the principle when the group (T1, T2) is working (LC1 is at a low potential, LC2 is at a high potential):

When CK is missing, Q(N), Q(N+4) will keep at high potentials. When the next frame is turned on and STV is at a high potential, T1 is opened, then LC1 is at a low potential, then T2 is at forward bias. Therefore, the low potential of LC1 is written to Q(N), Q(N+4) to pull the potentials of Q(N), Q(N+4) down, so it will not affect the normal display of the next frame.

At this moment, because LC2 is at a high potential, T4 is at reverse bias, the path of the group (T3, T4) is disconnected, and the high potential of LC2 does not affect the potential of Q (N).

Figure 7:
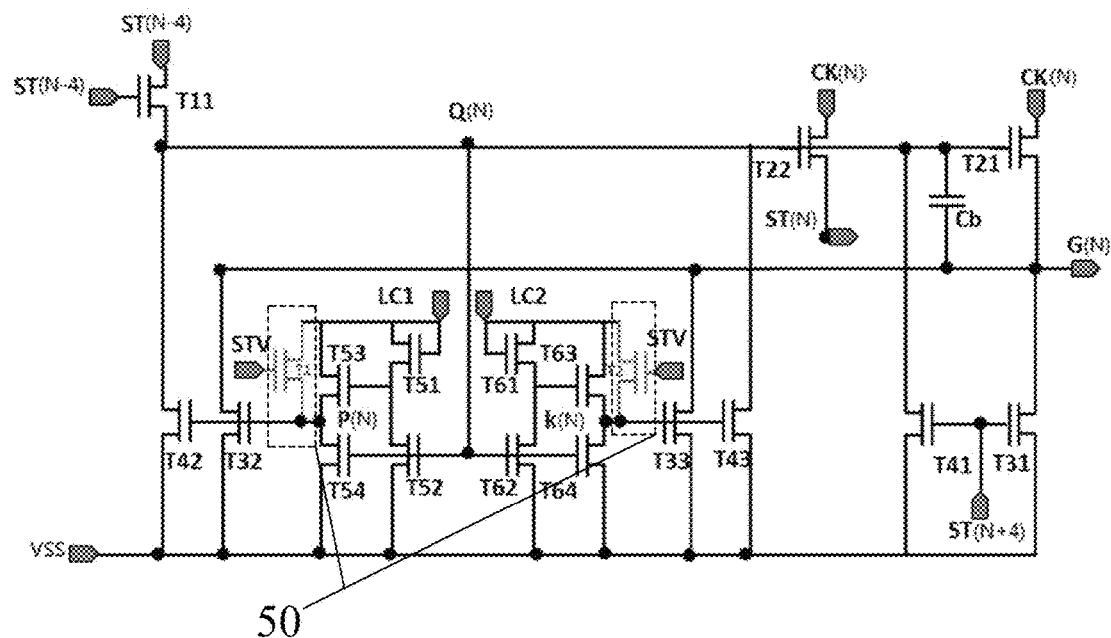
FIG. 7 shows an illustrative diagram of a ninth and following stage GOA circuits of another preferred embodiment according to the present invention.

Please refer to FIG. 7, which shows an illustrative diagram of a ninth and following stage GOA circuits of another preferred embodiment according to the present invention. The second kind of GOA circuit newly adds an additional circuit 50 which is constituted by two TFTs (T1, T2). T1 and LC1 is one group and T2 and LC2 is one group; the gate electrodes are both controlled by STV. The structure of the pull-high control unit 12, the pull-high stage-transfer unit 20, the pull-down unit 30, and the pull-down sustain unit 40 keeps unchanged. Compared with the first circuit, the circuit has the advantage of less TFT, but the disadvantage is that the high potential of Q(N) can be pulled down only with TFTs T42 or T43, the reaction speed is relatively slow.

The following is a description of the solution about CK missing.

The working principles of the two newly added units are the same. When LC1 is at a high potential, LC2 is at a low potential, the group (T1) works. Similarly, when LC1 is at a low potential, LC2 is at a high potential, the group (T2) works.

The following is the description of the principle when the group (T1) is working (LC1 is at a high potential, LC2 is at a low potential):

When CK is missing, Q(N), Q(N+4) will keep at high potentials. When the next frame is turned on and STV is at a high potential, T1 is opened, then LC1 is at a high potential, gate electrodes of T32, T42 are written with the high potential of LC1, then T32, T42 are opened. Therefore, the potential of Q(N), G(N), and Q(N+4) are pull down to VSS, so it will not affect the normal display of the next frame.

At this moment, because LC2 is at a low potential, the path of the group (T2) is disconnected, T33 and T43 are functionless.

Figure 8:
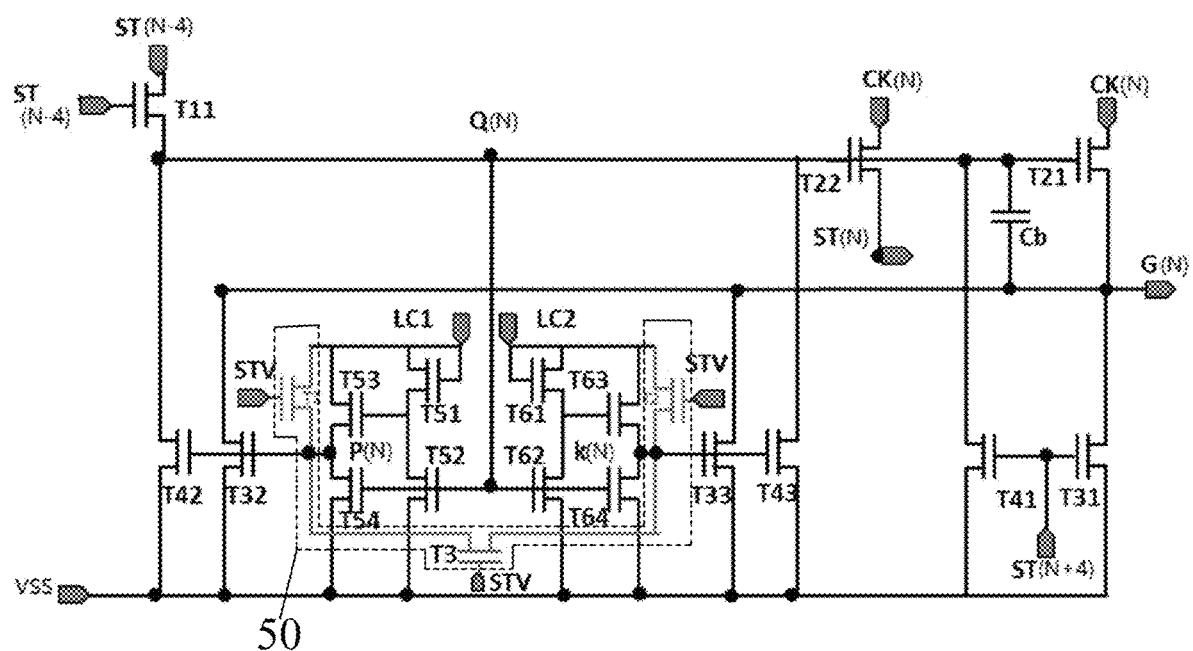
FIG. 8 shows an illustrative diagram of a ninth and following stage GOA circuits of still another preferred embodiment according to the present invention.

Please refer to FIG. 8, which shows an illustrative diagram of a ninth and following stage GOA circuits of still another preferred embodiment according to the present invention. The third kind of GOA circuit newly adds an additional circuit 50 which is constituted by three TFTs (T1, T2, and T3). The structure of the pull-high control unit 12, the pull-high stage-transfer unit 20, the pull-down unit 30, and the pull-down sustain unit 40 keeps unchanged. Compared with the second circuit, the advantage of this circuit is the reaction speed is relatively fast, but the disadvantage is one TFT is added.

The following is a description of the solution about CK missing.

The working principles of the two newly added units are the same. When LC1 is at a high potential, LC2 is at a low potential, the group (T1) works. Similarly, when LC1 is at a low potential, LC2 is at a high potential, the group (T2) works.

When LC1 is at a high potential, LC2 is at a low potential, the following is the description of the principle when the group (T1) is working:

When CK is missing, Q(N), Q(N+4) will keep at high potentials. When the next frame is turned on and STV is at a high potential, T1, T2, and T3 are opened, then LC1 is at a high potential, gate electrodes of T32, T42, T33, and T43 are all at high potentials, then the four TFTs are opened simultaneously. Therefore, there are two paths for pulling the potential of Q(N), G(N) down to a low potential of VSS, so the reaction speed is faster.

Figure 1:
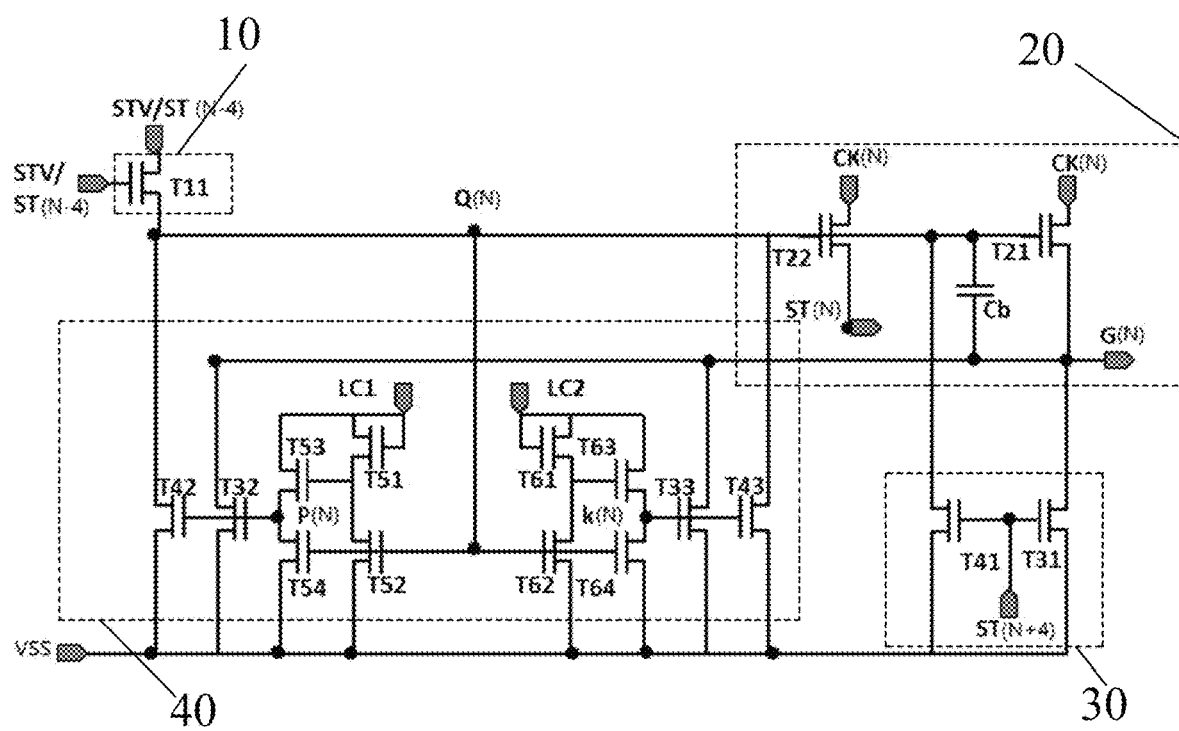
FIG. 1 shows a diagram of one stage GOA circuit.
Figure 2:
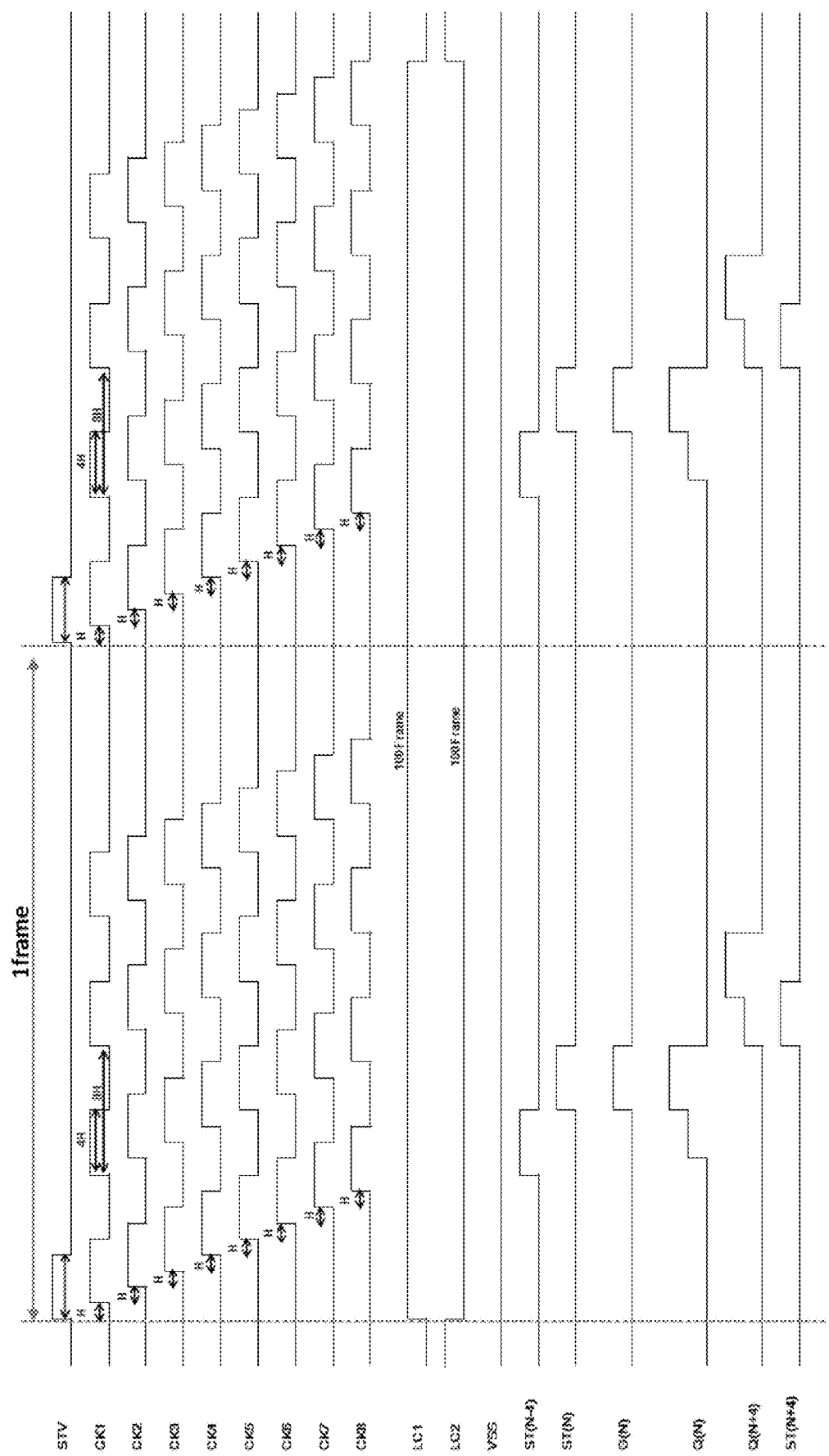
FIG. 2 shows an illustrative diagram of waveforms of signals, important nodes and voltages required to control the conventional GOA circuit.
Figure 3:
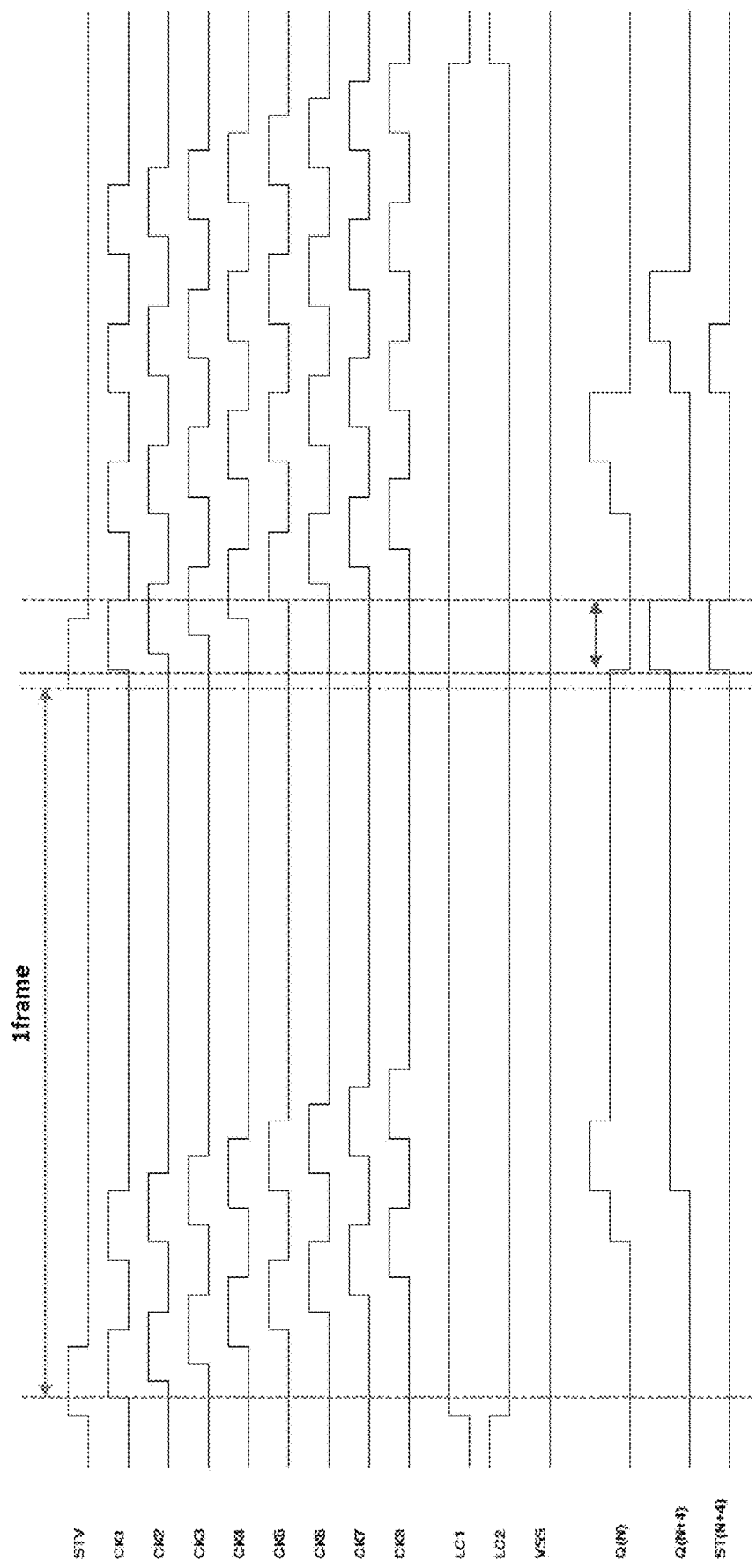
FIG. 3 shows an illustrative diagram of waveforms of the signals and important nodes required for controlling the GOA circuit when the clock signal CK is missing.
Figure 9:
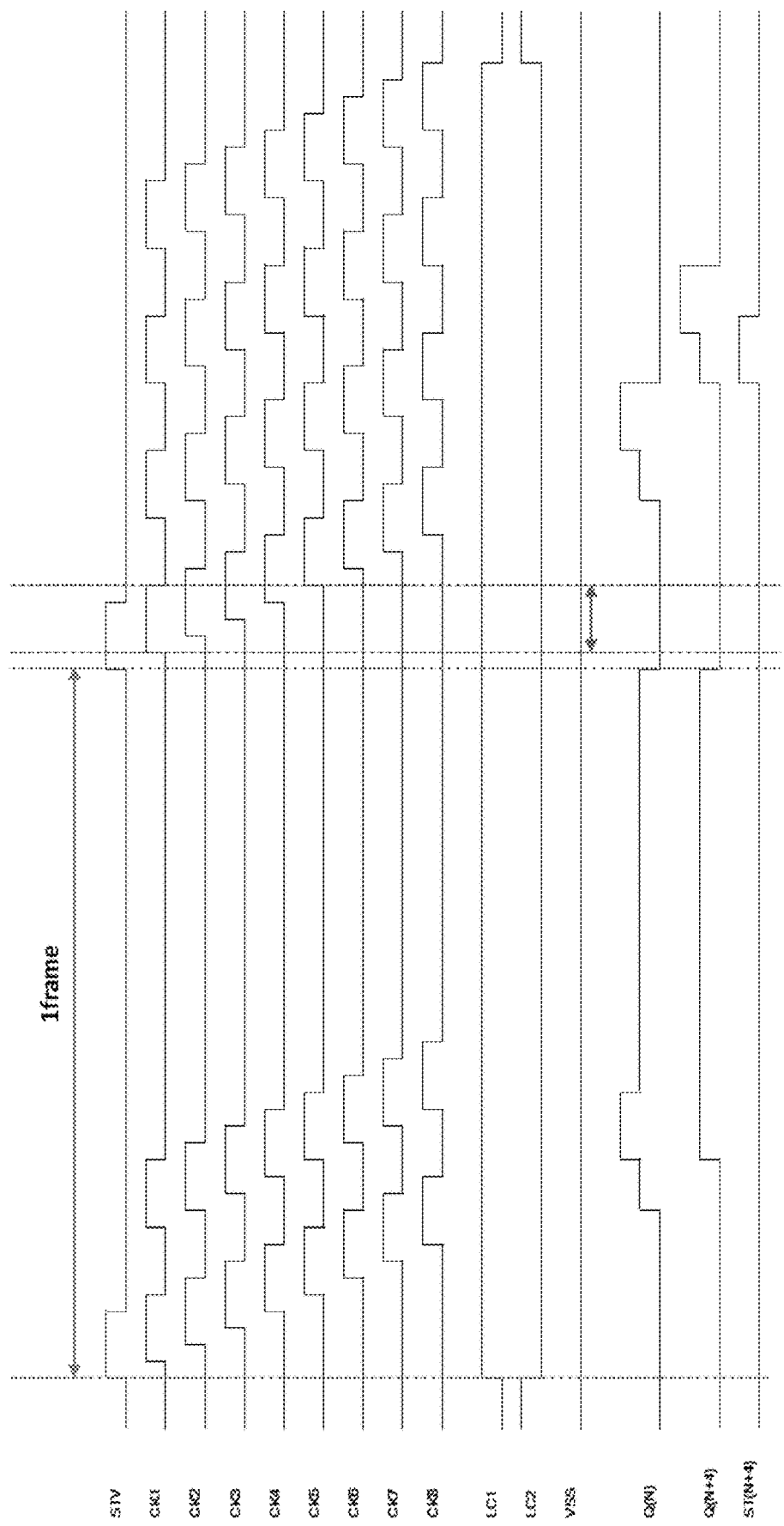
FIG. 9 shows an illustrative diagram of waveforms of the signals and important nodes required to a GOA circuit for preventing clock signals from missing the GOA circuit when the clock signal CK is missing.

Please refer to FIG. 9, which shows an illustrative diagram of waveforms of the signals and important nodes required to a GOA circuit for preventing clock signals from missing the GOA circuit when the clock signal CK is missing. This can help understand the solution of CK missing, and the specific signals and nodes are cross-referenced to FIGS. 2 and 3.

The GOA circuit for preventing a clock signal missing of the present invention can be applied to LCD displays or to OLED displays.

In summary, the GOA circuit for preventing clock signals from missing of the present invention, which solves the problem that the display signal is damaged due to the disappearance of the clock signal.

Two alternative functional pull-down modules of the pull-down sustain unit are respectively connected with a first low-frequency clock signal and a second low-frequency clock signal. The pull-high control unit is connected with the first node of the N-th stage GOA unit.

As mentioned above, those of ordinary skill in the art, without departing from the spirit and scope of the present invention, can make various kinds of modifications and variations to the present invention. Therefore, all such modifications and variations are intended to be included in the protection scope of the appended claims of the present invention.

What is claimed is:

1. A GOA circuit for preventing clock signals from missing, comprising: a plurality of cascaded GOA units, wherein the N-th stage GOA unit controls charging of the N-th stage horizontal scanning line, the N-th stage GOA unit comprises a pull-high control unit, a pull-high stage-transfer unit, a pull-down unit, and a pull-down sustain unit; the pull-high stage-transfer unit, the pull-down unit and the pull-down sustain unit are respectively connected with a first node and a gate signal output terminal of the N-th stage GOA unit, two alternative functional pull-down modules of the pull-down sustain unit are respectively connected with a first low-frequency clock signal and a second low-frequency clock signal, the pull-high control unit is connected with the first node of the N-th stage GOA unit;

from a specific stage, each of the GOA unit further comprises an additional circuit for preventing clock signals from missing, the additional circuit is connected with a start signal, the first low-frequency clock signal, and the second low-frequency clock signal; when the clock signal is missing and a next frame is turned on, the start signal passed through with a high potential, the first low-frequency clock signal and the second low-frequency clock signal which have reversed potential are capable of controlling the potential of the first node of the N-th stage GOA unit;

wherein the pull-down sustain unit comprises:

a first thin film transistor, a gate electrode of the first thin film transistor is connected with a second node of the N-th stage GOA unit, a source electrode and a drain electrode of the first thin film transistor are respectively connected with the gate signal output terminal and a constant low-voltage signal;

a second thin film transistor, a gate electrode of the second thin film transistor is connected with a third node of the N-th stage GOA unit, a source electrode and a drain electrode of second thin film transistor are respectively connected with the gate signal output terminal and the constant low-voltage signal;

a third thin film transistor, a gate electrode of the third thin film transistor is connected with the second node, a source electrode and a drain electrode of the third thin film transistor are respectively connected with the first node and the constant low-voltage signal;

a fourth thin film transistor, a gate electrode of the fourth thin film transistor is connected with the third node, a source electrode and a drain electrode of the fourth thin film transistor are respectively connected with the first node and the constant low-voltage signal;

a fifth thin film transistor, a gate electrode of the fifth thin film transistor is connected with the first low-frequency clock signal, a source electrode and a drain electrode of the fifth thin film transistor are respectively connected with the first low-frequency clock signal and a gate electrode of a sixth thin film transistor;

the sixth thin film transistor, a source electrode and a drain electrode of the sixth thin film transistor are respectively connected with the first low-frequency clock signal and the second node;

a seventh thin film transistor, a gate electrode of the seventh thin film transistor is connected with the first node, a source electrode and a drain electrode of the seventh thin film transistor are respectively connected with the constant low-voltage signal and the gate electrode of the sixth thin film transistor;

an eighth thin film transistor, a gate electrode of the eighth thin film transistor is connected with the first node, a source electrode and a drain electrode of the eighth thin film transistor are respectively connected with the constant low-voltage signal and the second node;

a ninth thin film transistor, a gate electrode of the ninth thin film transistor is connected with the second low-frequency clock signal, a source electrode and a drain electrode of the ninth thin film transistor are respectively connected with the second low-frequency clock signal and a gate electrode of a tenth thin film transistor;

the tenth thin film transistor, a source electrode and a drain electrode of the tenth thin film transistor are respectively connected with the second low-frequency clock signal and the third node;

an eleventh thin film transistor, a gate electrode of the eleventh thin film transistor is connected with the first node, a source electrode and a drain electrode of the eleventh thin film transistor are respectively connected the constant low-voltage signal and the gate of the tenth thin film transistor;

a twelfth thin film transistor, a gate electrode of the twelfth thin film transistor is connected with the first node, a source electrode and a drain electrode of the twelfth thin film transistor are respectively connected with the constant low-voltage signal and the third node.

2. The GOA circuit for preventing clock signals from missing according to claim 1, wherein the additional circuit comprises:

a thirteenth thin film transistor, a gate electrode of the thirteenth thin film transistor is connected with the start signal, a source electrode and a drain electrode of the thirteenth thin film transistor are respectively connected with the first node and a gate of a fourteenth thin film transistor;

the fourteenth thin film transistor, a source electrode and a drain electrode of the fourteenth thin film transistor are respectively connected with the gate of the fourteenth thin film transistor and the first low-frequency clock signal;

a fifteenth thin film transistor, a gate electrode of the fifteenth thin film transistor is connected with the start signal, a source electrode and a drain electrode of the fifteenth thin film transistor are respectively connected with the first node and a gate electrode of a sixteenth thin film transistor;

the sixteenth thin film transistor, a source electrode and a drain electrode of the sixteenth thin film transistor are respectively connected with the gate of the sixteenth thin film transistor and the second low-frequency clock signal.

3. The GOA circuit for preventing clock signals from missing according to claim 1, wherein the additional circuit comprises:

a seventeenth thin film transistor, a gate electrode of the seventeenth thin film transistor is connected with the start signal, a source electrode and a drain electrode of the seventeenth thin film transistor are respectively connected with the first low-frequency clock signal and the second node; and an eighteenth thin film transistor, a gate electrode of the eighteenth thin film transistor is connected with the start signal, a source electrode and a drain electrode of the eighteenth thin film transistor are respectively connected with the second low-frequency clock signal and the third node.

4. The GOA circuit for preventing clock signals from missing according to claim 1, wherein the additional circuit comprises:

a seventeenth thin film transistor, a gate electrode of the seventeenth thin film transistor is connected with the start signal, a source electrode and a drain electrode of the seventeenth thin film transistor are respectively connected with the first low-frequency clock signal and the second node;

an eighteenth thin film transistor, a gate electrode of the eighteenth thin film transistor is connected with the start signal, a source electrode and a drain electrode of the eighteenth thin film transistor are respectively connected with the second low-frequency clock signal and the third node; and a nineteenth thin film transistor, a gate electrode of the nineteenth thin film transistor is connected with the start signal, a source electrode and a drain electrode of the nineteenth thin film transistor are respectively connected with the second node and the third node.

5. The GOA circuit for preventing clock signals from missing according to claim 1, wherein the pull-high control unit comprises a twentieth thin film transistor;

for top four GOA units, a gate of the twentieth thin film transistor is connected with the start signal, and a source electrode and a drain electrode of the twentieth thin film transistor are respectively connected with the start signal and the first node.

6. The GOA circuit for preventing clock signals from missing according to claim 5, wherein from a fifth stage GOA unit, the gate of the twentieth thin film transistor is connected with a stage-transfer signal output terminal of a (N−4)th stage GOA unit, and the source electrode and the drain electrode of the twentieth thin film transistor are respectively connected with the stage-transfer signal output terminal and the first node.

7. The GOA circuit for preventing clock signals from missing according to claim 5, wherein from a ninth stage, each of the GOA unit comprises the additional circuit for preventing clock signals from missing.

8. The GOA circuit for preventing clock signals from missing according to claim 1, wherein the pull-high stage-transfer unit comprises:

a twenty-first thin film transistor, a gate of the twenty-first thin film transistor is connected with the first node, and a source electrode and a drain electrode of the twenty-first thin film transistor are respectively connected with the gate signal output terminal and a clock signal of a N-th stage GOA unit;

a twenty-second thin film transistor, a gate of the twenty-second thin film transistor is connected with the first node, and a source electrode and a drain electrode of the twenty-second thin film transistor are respectively connected with a stage-transfer signal output terminal of the N-th stage GOA unit and a clock signal of the N-th stage GOA unit; and a bootstrap capacitor comprises two terminals are respectively connected with the first node and the gate signal output terminal.

9. The GOA circuit for preventing clock signals from missing according to claim 1, wherein the pull-down unit comprises:

a twenty-third thin film transistor, a gate of the twenty-third thin film transistor is connected with a stage-transfer signal output terminal of the (N+4)th stage GOA unit, and a source electrode and a drain electrode of the twenty-third thin film transistor are respectively connected with the first node and the constant low-voltage signal; and a twenty-fourth thin film transistor, a gate of the twenty-fourth thin film transistor is connected with the stage-transfer signal output terminal of the (N+4)th stage GOA unit, and a source electrode and a drain electrode of the twenty-fourth thin film transistor are respectively connected with the gate signal output terminal and the constant low-voltage signal.

10. A GOA circuit for preventing clock signals from missing, comprising: a plurality of cascaded GOA units, wherein the N-th stage GOA unit controls charging of the N-th stage horizontal scanning line, the N-th stage GOA unit comprises a pull-high control unit, a pull-high stage-transfer unit, a pull-down unit, and a pull-down sustain unit; the pull-high stage-transfer unit, the pull-down unit and the pull-down sustain unit are respectively connected with a first node and a gate signal output terminal of the N-th stage GOA unit, two alternative functional pull-down modules of the pull-down sustain unit are respectively connected with a first low-frequency clock signal and a second low-frequency clock signal, the pull-high control unit is connected with the first node of the N-th stage GOA unit;

from a specific stage, each of the GOA unit further comprises an additional circuit for preventing clock signals from missing, the additional circuit is connected with a start signal, the first low-frequency clock signal, and the second low-frequency clock signal; when the clock signal is missing and a next frame is turned on, the start signal passed through with a high potential, the first low-frequency clock signal and the second low-frequency clock signal which have reversed potential are capable of controlling the potential of the first node of the N-th stage GOA unit;

wherein the pull-down sustain unit comprises:

a first thin film transistor, a gate electrode of the first thin film transistor is connected with a second node of the N-th stage GOA unit, a source electrode and a drain electrode of the first thin film transistor are respectively connected with the gate signal output terminal and a constant low-voltage signal;

a second thin film transistor, a gate electrode of the second thin film transistor is connected with a third node of the N-th stage GOA unit, a source electrode and a drain electrode of second thin film transistor are respectively connected with the gate signal output terminal and the constant low-voltage signal;

a third thin film transistor, a gate electrode of the third thin film transistor is connected with the second node, a source electrode and a drain electrode of the third thin film transistor are respectively connected with the first node and the constant low-voltage signal;

a fourth thin film transistor, a gate electrode of the fourth thin film transistor is connected with the third node, a source electrode and a drain electrode of the fourth thin film transistor are respectively connected with the first node and the constant low-voltage signal;

a fifth thin film transistor, a gate electrode of the fifth thin film transistor is connected with the first low-frequency clock signal, a source electrode and a drain electrode of the fifth thin film transistor are respectively connected with the first low-frequency clock signal and a gate electrode of a sixth thin film transistor;

the sixth thin film transistor, a source electrode and a drain electrode of the sixth thin film transistor are respectively connected with the first low-frequency clock signal and the second node;

a seventh thin film transistor, a gate electrode of the seventh thin film transistor is connected with the first node, a source electrode and a drain electrode of the seventh thin film transistor are respectively connected with the constant low-voltage signal and the gate electrode of the sixth thin film transistor;

an eighth thin film transistor, a gate electrode of the eighth thin film transistor is connected with the first node, a source electrode and a drain electrode of the eighth thin film transistor are respectively connected with the constant low-voltage signal and the second node;

a ninth thin film transistor, a gate electrode of the ninth thin film transistor is connected with the second low-frequency clock signal, a source electrode and a drain electrode of the ninth thin film transistor are respectively connected with the second low-frequency clock signal and a gate electrode of a tenth thin film transistor;

the tenth thin film transistor, a source electrode and a drain electrode of the tenth thin film transistor are respectively connected with the second low-frequency clock signal and the third node;

an eleventh thin film transistor, a gate electrode of the eleventh thin film transistor is connected with the first node, a source electrode and a drain electrode of the eleventh thin film transistor are respectively connected the constant low-voltage signal and the gate of the tenth thin film transistor;

a twelfth thin film transistor, a gate electrode of the twelfth thin film transistor is connected with the first node, a source electrode and a drain electrode of the twelfth thin film transistor are respectively connected with the constant low-voltage signal and the third node;

wherein the pull-high control unit comprises a twentieth thin film transistor;

for top four GOA units, a gate of the twentieth thin film transistor is connected with the start signal, and a source electrode and a drain electrode of the twentieth thin film transistor are respectively connected with the start signal and the first node;

wherein from a fifth stage GOA unit, the gate of the twentieth thin film transistor is connected with a stage-transfer signal output terminal of a (N−4)th stage GOA unit, and the source electrode and the drain electrode of the twentieth thin film transistor are respectively connected with the stage-transfer signal output terminal and the first node;

wherein from a ninth stage, each of the GOA unit comprises the additional circuit for preventing clock signals from missing;

wherein the pull-high stage-transfer unit comprises:

a twenty-first thin film transistor, a gate of the twenty-first thin film transistor is connected with the first node, and a source electrode and a drain electrode of the twenty-first thin film transistor are respectively connected with the gate signal output terminal and a clock signal of a N-th stage GOA unit;

a twenty-second thin film transistor, a gate of the twenty-second thin film transistor is connected with the first node, and a source electrode and a drain electrode of the twenty-second thin film transistor are respectively connected with a stage-transfer signal output terminal of the N-th stage GOA unit and a clock signal of the N-th stage GOA unit; and a bootstrap capacitor comprises two terminals are respectively connected with the first node and the gate signal output terminal.

11. The GOA circuit for preventing clock signals from missing according to claim 10, wherein the additional circuit comprises:

a thirteenth thin film transistor, a gate electrode of the thirteenth thin film transistor is connected with the start signal, a source electrode and a drain electrode of the thirteenth thin film transistor are respectively connected with the first node and a gate of a fourteenth thin film transistor;

the fourteenth thin film transistor, a source electrode and a drain electrode of the fourteenth thin film transistor are respectively connected with the gate of the fourteenth thin film transistor and the first low-frequency clock signal;

a fifteenth thin film transistor, a gate electrode of the fifteenth thin film transistor is connected with the start signal, a source electrode and a drain electrode of the fifteenth thin film transistor are respectively connected with the first node and a gate electrode of a sixteenth thin film transistor;

the sixteenth thin film transistor, a source electrode and a drain electrode of the sixteenth thin film transistor are respectively connected with the gate of the sixteenth thin film transistor and the second low-frequency clock signal.

12. The GOA circuit for preventing clock signals from missing according to claim 10, wherein the additional circuit comprises:

a seventeenth thin film transistor, a gate electrode of the seventeenth thin film transistor is connected with the start signal, a source electrode and a drain electrode of the seventeenth thin film transistor are respectively connected with the first low-frequency clock signal and the second node; and an eighteenth thin film transistor, a gate electrode of the eighteenth thin film transistor is connected with the start signal, a source electrode and a drain electrode of the eighteenth thin film transistor are respectively connected with the second low-frequency clock signal and the third node.

13. The GOA circuit for preventing clock signals from missing according to claim 10, wherein the additional circuit comprises:

a seventeenth thin film transistor, a gate electrode of the seventeenth thin film transistor is connected with the start signal, a source electrode and a drain electrode of the seventeenth thin film transistor are respectively connected with the first low-frequency clock signal and the second node;

an eighteenth thin film transistor, a gate electrode of the eighteenth thin film transistor is connected with the start signal, a source electrode and a drain electrode of the eighteenth thin film transistor are respectively connected with the second low-frequency clock signal and the third node; and a nineteenth thin film transistor, a gate electrode of the nineteenth thin film transistor is connected with the start signal, a source electrode and a drain electrode of the nineteenth thin film transistor are respectively connected with the second node and the third node.

14. The GOA circuit for preventing clock signals from missing according to claim 10, wherein the pull-down unit comprises:

a twenty-third thin film transistor, a gate of the twenty-third thin film transistor is connected with a stage-transfer signal output terminal of the (N+4)th stage GOA unit, and a source electrode and a drain electrode of the twenty-third thin film transistor are respectively connected with the first node and the constant low-voltage signal; and a twenty-fourth thin film transistor, a gate of the twenty-fourth thin film transistor is connected with the stage-transfer signal output terminal of the (N+4)th stage GOA unit, and a source electrode and a drain electrode of the twenty-fourth thin film transistor are respectively connected with the gate signal output terminal and the constant low-voltage signal.

* * * * *